(12) United States Patent
Aramaki

(10) Patent No.: US 10,012,453 B2
(45) Date of Patent: *Jul. 3, 2018

(54) THERMALLY CONDUCTIVE SHEET AND METHOD FOR PRODUCING THERMALLY CONDUCTIVE SHEET

(71) Applicant: Dexerials Corporation, Shinagawa-ku, Tokyo (JP)

(72) Inventor: Keisuke Aramaki, Tokyo (JP)

(73) Assignee: Dexerials Corporation, Tokyo (JP)

( * ) Notice: Subject to any disclaimer, the term of this patent is extended or adjusted under 35 U.S.C. 154(b) by 163 days.

This patent is subject to a terminal disclaimer.

(21) Appl. No.: 14/962,788

(22) Filed: Dec. 8, 2015

(65) Prior Publication Data

US 2016/0091265 A1    Mar. 31, 2016

Related U.S. Application Data

(63) Continuation of application No. PCT/JP2014/065977, filed on Jun. 17, 2014.

(30) Foreign Application Priority Data

Jun. 19, 2013 (JP) .................................. 2013-128534

(51) Int. Cl.
  *B32B 3/02* (2006.01)
  *F28F 21/02* (2006.01)
  (Continued)

(52) U.S. Cl.
  CPC .......... *F28F 21/02* (2013.01); *B29C 47/0004* (2013.01); *B29C 47/0021* (2013.01);
  (Continued)

(58) Field of Classification Search
  CPC .......... C08K 3/22; C08K 3/28; C08K 3/0083; C08K 7/06; C08K 2201/001;
  (Continued)

(56) References Cited

U.S. PATENT DOCUMENTS

| | | |
|---|---|---|
| 2007/0231552 A1 | 10/2007 | Yoda et al. |
| 2007/0284366 A1 | 12/2007 | Ohta |
| 2013/0136895 A1 | 5/2013 | Usui et al. |

FOREIGN PATENT DOCUMENTS

| | | |
|---|---|---|
| CN | 103975429 | 8/2014 |
| JP | 2004-363272 | 12/2004 |

(Continued)

OTHER PUBLICATIONS

Chinese Office Action for Application No. 2014800341790, State Intellectual Property Office of the People's Republic of China, dated Aug. 24, 2017.

(Continued)

*Primary Examiner* — Elizabeth E Mulvaney
(74) *Attorney, Agent, or Firm* — Carmody Torrance Sandak & Hennessey LLP

(57) ABSTRACT

A thermally conductive sheet having good thermal conductivity in the thickness direction and a method for producing a thermally conductive sheet. A thermally conductive sheet having a surface with an L* value in a L*a*b color system of 29 or more and 47 or less is obtained by preparing a thermally conductive composition comprising a curable resin composition, thermally conductive fibers, and thermally conductive particles, extrusion-molding the thermally conductive composition to obtain a columnar cured product, and cutting the columnar cured product in a direction almost perpendicular to a length direction of a column to a predetermined thickness.

9 Claims, 8 Drawing Sheets

(51) Int. Cl.
- *C08K 3/22* (2006.01)
- *C08K 3/28* (2006.01)
- *C08K 7/06* (2006.01)
- *H01L 23/373* (2006.01)
- *B29C 47/00* (2006.01)
- *B29C 47/08* (2006.01)
- *F28F 21/04* (2006.01)
- *F28F 21/06* (2006.01)
- *C08K 3/105* (2018.01)
- *B29K 83/00* (2006.01)
- *B29K 105/12* (2006.01)
- *B29K 105/16* (2006.01)
- *B29L 31/18* (2006.01)

(52) U.S. Cl.
CPC ...... *B29C 47/0069* (2013.01); *B29C 47/0869* (2013.01); *C08K 3/105* (2018.01); *C08K 3/22* (2013.01); *C08K 3/28* (2013.01); *C08K 7/06* (2013.01); *F28F 21/04* (2013.01); *F28F 21/065* (2013.01); *H01L 23/3737* (2013.01); *B29C 47/0016* (2013.01); *B29C 47/0066* (2013.01); *B29C 2793/0027* (2013.01); *B29K 2083/00* (2013.01); *B29K 2105/12* (2013.01); *B29K 2105/16* (2013.01); *B29K 2995/0013* (2013.01); *B29L 2031/18* (2013.01); *C08K 2003/2227* (2013.01); *C08K 2003/282* (2013.01); *C08K 2201/004* (2013.01); *H01L 2924/0002* (2013.01)

(58) Field of Classification Search
CPC ........ C08K 2201/004; C08K 2003/282; B29C 47/0004; B29C 47/0016; B29C 47/0021; B29C 47/0066; B29C 47/0069; B29C 47/0869; B29K 2105/12; B29K 2105/16; B29K 2083/00; F28F 21/02; F28F 21/04; F28F 21/065

See application file for complete search history.

(56) References Cited

FOREIGN PATENT DOCUMENTS

| | | |
|---|---|---|
| JP | 2000-345040 | 12/2006 |
| JP | 2006-335957 | 12/2006 |
| JP | 2002-046137 | 2/2007 |
| JP | 2007-277405 | 10/2007 |
| JP | 2007-277406 | 10/2007 |
| JP | 2007-326976 | 12/2007 |
| JP | 2009-055021 | 3/2009 |
| JP | 2010-050240 | 3/2010 |
| JP | 2010-056299 | 3/2010 |
| JP | 2011-249681 | 12/2011 |
| JP | 2012-001638 | 1/2012 |
| JP | 2012-023335 | 2/2012 |
| JP | 2013-131562 | 7/2013 |
| JP | 2013-131564 | 7/2013 |

OTHER PUBLICATIONS

Notice of Reasons for Rejection, dated Mar. 12, 2015, for Japanese Patent Application No. JP 2014-086432, which corresponds to U.S. Pat. No. 9,437,521.

International Search Report dated Sep. 30, 2014, for International Patent Application No. PCT/JP2014/068258, which corresponds to U.S. Pat. No. 9,437,521.

International Preliminary Report on Patentability dated Oct. 10, 2015 for International Patent Application No. PCT/JP2014/068258, which corresponds to U.S. Pat. No. 9,437,521.

Notice of Reasons for Rejection, dated Aug. 23, 2016, for corresponding Japanese Patent Application No. 2013-128534.

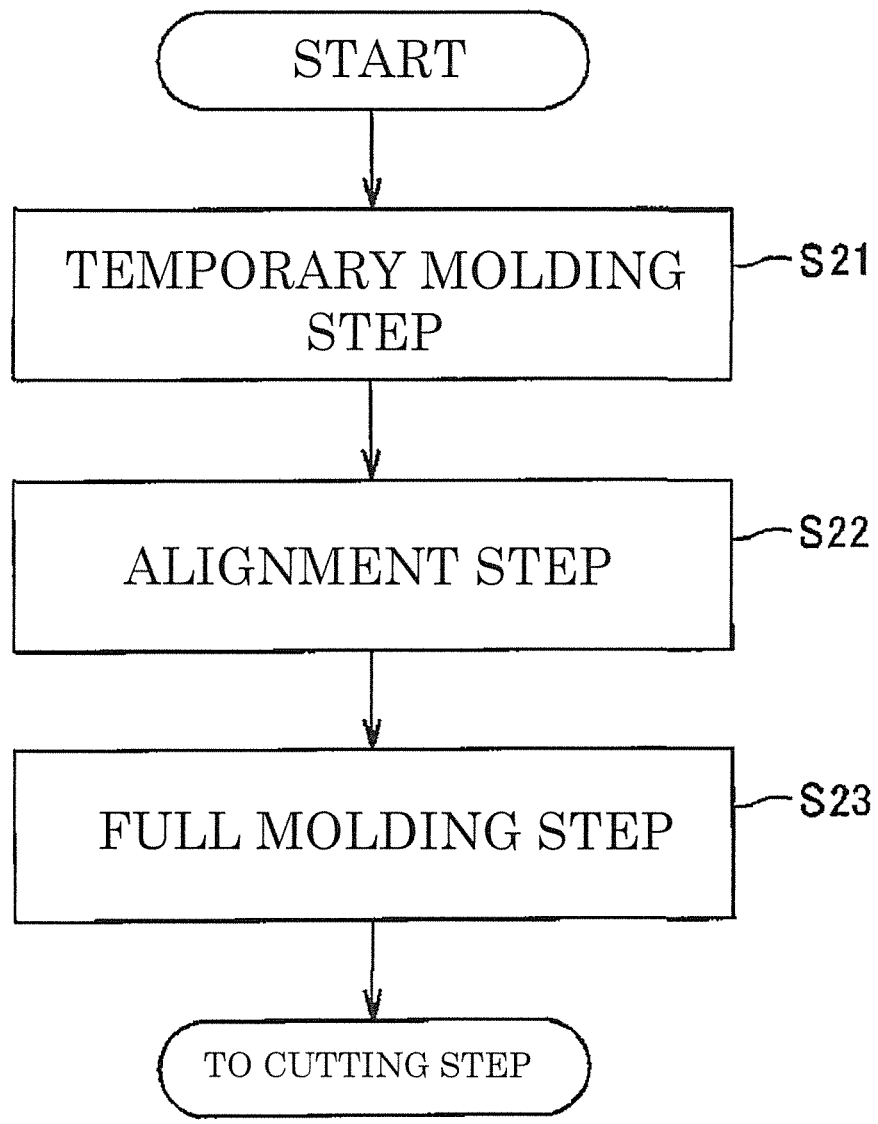

THERMALLY CONDUCTIVE SHEET AND METHOD FOR PRODUCING THERMALLY CONDUCTIVE SHEET

CROSS-REFERENCE TO RELATED APPLICATION

This application is a continuation application of International Application PCT/JP2014/065977 filed on Jun. 17, 2014 and designated the U.S., the entire contents of which are incorporated herein by reference.

BACKGROUND OF THE INVENTION

Field of the Invention

The present invention relates to a thermally conductive sheet that promotes the heat dissipation of a heat-generating electronic part or the like, and a method for producing a thermally conductive sheet. The present application claims priority to Japanese Patent Application No. 2013-128534 filed in Japan on Jun. 19, 2013, which is incorporated into the present application by reference.

Description of the Related Art

With higher performance of electronic equipment, higher density and higher packaging of semiconductor devices have proceeded. With this, it is important to more efficiently dissipate heat generated from electronic parts constituting electronic equipment. A semiconductor is attached to a heat sink such as a heat-dissipating fan or a heat-dissipating plate via a thermally conductive sheet in order to efficiently dissipate heat. As the thermally conductive sheet, sheets of silicone in which a filler such as an inorganic filler is dispersed and contained are widely used.

A further improvement in thermal conductivity is required of such heat-dissipating members, and this is generally addressed by increasing the filling rate of the inorganic filler blended in the matrix for the purpose of high thermal conductivity. But, when the filling rate of the inorganic filler is increased, the flexibility is impaired, and powder falling occurs due to the high filling rate of the inorganic filler. Therefore there is a limit to increasing the filling rate of the inorganic filler.

Examples of the inorganic filler include alumina, aluminum nitride, and aluminum hydroxide. In addition, for the purpose of high thermal conductivity, the matrix may be filled with scaly particles of boron nitride, graphite, or the like, carbon fibers, or the like. This relies on the anisotropy of the thermal conductivity of the scaly particles or the like. For example, in the case of carbon fibers, they have a thermal conductivity of about 600 W/mK to about 1200 W/mK in the fiber direction. In the case of boron nitride, it has a thermal conductivity of about 110 W/mK in the plane direction and a thermal conductivity of the order of about 2 W/mK in the direction perpendicular to the plane direction and is known to have anisotropy.

Japanese Patent Application Laid-Open (JP-A) No. 2006-335957 describes a method of applying a thermally conductive composition containing carbon fibers, and applying a magnetic field to orient the carbon fibers. But, in order that the carbon fibers may be oriented, fluidity is necessary, and therefore in the method described in JP-A No. 2006-335957, the amount of the thermally conductive filler filled cannot be increased.

SUMMARY OF THE INVENTION

The present invention has been proposed in view of such circumstances, and it is an object of the present invention to provide a thermally conductive sheet having good thermal conductivity in the thickness direction and a method for producing a thermally conductive sheet.

As a result of diligent studies, the inventor of the present invention has found that good thermal conductivity is obtained by the fact that the value of lightness $L^*$, which is represented by the "$L^*$" value in the $L^*a^*b$ color system described in "JIS Z 8729" and "JIS Z 8730" when the surface of a thermally conductive sheet is measured, is in a predetermined range, leading to the completion of the present invention.

Specifically, a thermally conductive sheet according to the present invention is characterized in that the sheet contains a curable resin composition; thermally conductive fibers; and thermally conductive particles, and that an $L^*$ value in a $L^*a^*b$ color system of a surface of the thermally conductive sheet is 29 or more and 47 or less.

In addition, a method for producing a thermally conductive sheet according to the present invention is characterized by including preparing a thermally conductive composition containing a curable resin composition, thermally conductive fibers, and thermally conductive particles; extrusion-molding the thermally conductive composition to obtain a columnar cured product; and cutting the columnar cured product in a direction almost perpendicular to a length direction of a column to a predetermined thickness to obtain a thermally conductive sheet having a surface with an $L^*$ value in a $L^*a^*b$ color system of 29 or more and 47 or less.

According to the present invention, by containing a curable resin composition, thermally conductive fibers, and thermally conductive particles, and the $L^*$ value in the $L^*a^*b$ color system of the surface of a thermally conductive sheet being 29 or more and 47 or less, the thermal conductivity of the thermally conductive sheet in the thickness direction can be good.

BRIEF DESCRIPTION OF THE DRAWINGS

FIG. 4 is a flow chart for explaining one example of an arrangement step in another method for producing a thermally conductive sheet according to the present invention.

DETAILED DESCRIPTION OF THE INVENTION

Figure 1:
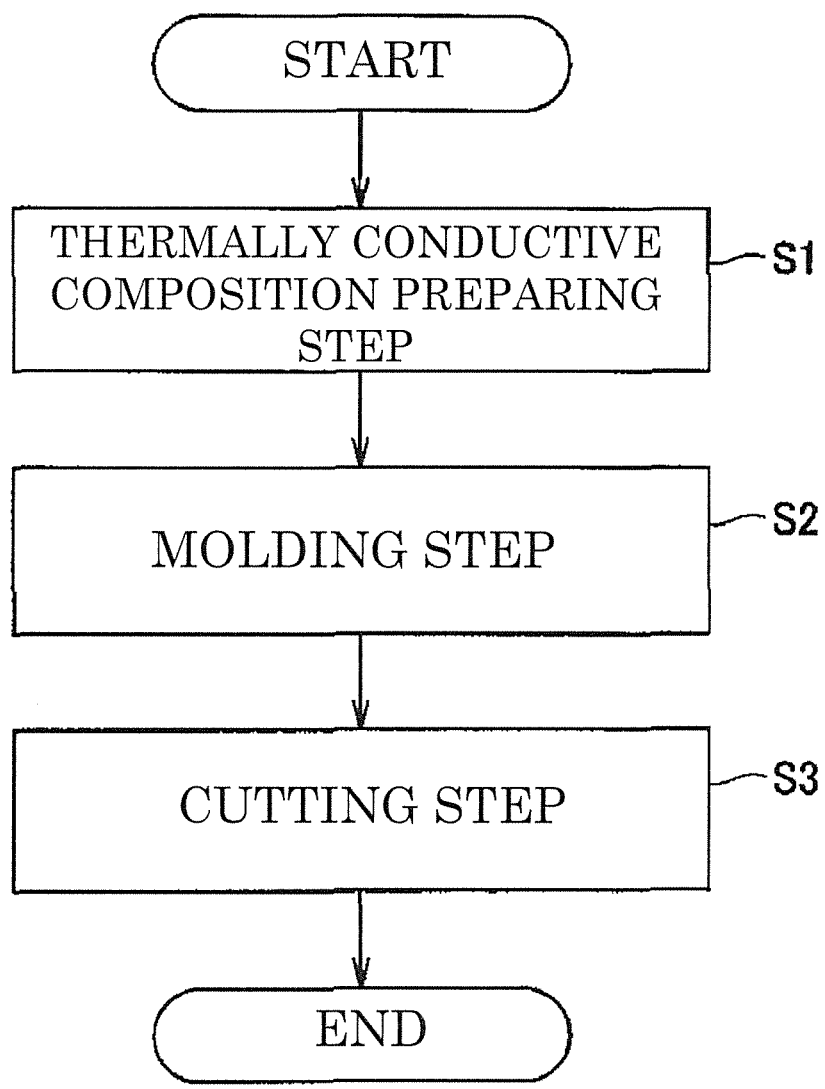
FIG. 1 is a flow chart for explaining one example of a method for producing a thermally conductive sheet according to the present invention.

An embodiment of the present invention (hereinafter referred to as this embodiment) will be described below in detail in the following order with reference to the drawings.
1. Thermally Conductive Sheet
2. Method for Producing Thermally Conductive Sheet
3. Another Method for Producing Thermally Conductive Sheet
4. Examples
<1. Thermally Conductive Sheet>
[Regarding Lightness L* in L*a*b Color System]

The color of an object is generally composed of three elements: lightness (brightness), hue (tint), and saturation (vividness). In order to accurately measure and express these, a color system for objectively converting these into numerical values and expressing these is necessary. Examples of such a color system include the L*a*b color system. In the L*a*b color system, measurement can be easily performed by a measuring instrument, for example, a commercially available spectrocolorimeter.

The L*a*b color system is, for example, a color system described in "JIS Z 8729" and "JIS Z 8730" and is represented by disposing each color in a spherical color space. In the L*a*b color system, lightness is represented by a position in the vertical axis (z axis) direction, hue is represented by a position in the outer periphery direction, and saturation is represented by a distance from the central axis.

The position in the vertical axis (z axis) direction representing lightness is represented by L*. The value of the lightness L* is a positive number. As the number becomes smaller, the lightness becomes lower, i.e., the color tends to become dark. Specifically, the value of L* changes from 0 corresponding to black to 100 corresponding to white.

In addition, in a cross-sectional view of a spherical color space horizontally cut at the position of L*=50, the positive direction of the x axis is the red direction, the positive direction of the y axis is the yellow direction, the negative direction of the x axis is the green direction, and the negative direction of the y axis is the blue direction. The position in the x axis direction is represented by a* taking a value of −60 to +60. The position in the y axis direction is represented by b* taking a value of −60 to +60. In this manner, a* and b* are positive or negative numbers representing chromaticity. As a* and b* approach 0, the color becomes black. The hue and the saturation are represented by these values of a* and b*.

In the L*a*b color system, when the lightness L* increases, the color becomes whitish, and when the lightness L* decreases, the color becomes blackish. In addition, in the L*a*b color system, when a* is less than −1, the color becomes greenish, and when a* is −1 or more, the color becomes reddish. In addition, when b* is less than −1, the color becomes blueish, and when b* is more than +1, the color becomes yellowish.

A thermally conductive sheet according to this embodiment contains a curable resin composition, thermally conductive fibers, and thermally conductive particles. When the content in % by volume of the thermally conductive fibers is increased, the lightness L* of the surface tends to decrease, and when the % by volume of the thermally conductive particles is increased, the lightness L* tends to increase. Specifically, it is as follows: the surface of a thermally conductive sheet in which the thermally conductive fibers are carbon fibers, and in which the thermally conductive particles are alumina, combination of alumina and aluminum nitride, combination of alumina and aluminum hydroxide, or combination of alumina, aluminum nitride, and aluminum hydroxide is observed; when the area of the carbon fibers is large with the small amount of white alumina and aluminum nitride exposed to the surface, the lightness L* tends to decrease; and when the area of the carbon fibers is small with the large amount of the white alumina and aluminum nitride exposed to the surface, the lightness L* tends to increase.

In order to obtain a thermally conductive sheet having high thermal conductivity, thermally conductive particles must be added in order to retain the shape, rather than simply increasing the content of thermally conductive fibers having high thermal conductivity. In addition, in order to lower the viscosity of the thermally conductive composition during extrusion, the thermally conductive fibers and the thermally conductive particles must be blended in appropriate amounts.

As a result of diligent studies, the inventor of the present invention has found that good thermal conductivity can be obtained by the value of lightness L* being in a predetermined range. In other words, the thermally conductive sheet according to this embodiment contains a curable resin composition, thermally conductive fibers, and thermally conductive particles, and the L* value in the L*a*b color system of the surface of the thermally conductive sheet is 29 or more and 47 or less. Thus, the thermal conductivity of the thermally conductive sheet in the thickness direction can be good.

In addition, a mottled pattern or streaky lines may be formed on the surface of the thermally conductive sheet. This is because when the thermally conductive composition is extruded into a hollow mold, shades of color are generated on the surface in a process in which the thermally conducting composition that has passed through and exited a slit adheres closely to each other inside the hollow mold. When a mottled pattern or streaky lines are formed on the surface of the thermally conductive sheet, the carbon fibers are not oriented in a fixed direction in the thickness direction and are randomly oriented. But, the lightness L* is determined by the area of the carbon fibers, the alumina, and the like on the surface regardless of the orientation direction of the carbon fibers. Therefore, when a mottled pattern or streaky lines are formed on the surface of the thermally conductive sheet, the L* value per unit area of the surface of the thermally conductive sheet should be 29 or more and 47 or less.

In addition, the L* value of the surface of the thermally conductive sheet can be adjusted by adjusting mixing time. When the mixing time is increased, the L* value tends to decrease, and when the mixing time is decreased, the L* value tends to increase. It is considered that when the mixing time is long, the area of the carbon fibers on the thermally conductive sheet surface increases, and the amount of the white alumina and aluminum nitride exposed to the surface decreases. In addition, when the surface of the sheet is glossy, the L* value tends to increase.

The L*a*b color system is taken as an example in the above-described description, but the way of selecting a color system is not particularly limited, and the color system should be a color system that can be converted into the L*a*b color system. For example, the color system may be the XYZ color system or the L*C*h color system.

The curable resin composition, the thermally conductive fibers, the thermally conductive particles, and the like constituting the thermally conductive sheet according to this embodiment will be described below.

[Curable Resin Composition]

The curable resin composition is not particularly limited and can be appropriately selected according to the performance required of the thermally conductive sheet. For example, thermoplastic polymers or thermosetting polymers can be used.

Examples of the thermoplastic polymers include thermoplastic resins, thermoplastic elastomers, or polymer alloys thereof.

The thermoplastic resins are not particularly limited and can be appropriately selected according to the purpose. Examples of the thermoplastic resins include ethylene-α-olefin copolymers such as polyethylene, polypropylene, and ethylene-propylene copolymers; polymethylpentene, polyvinyl chloride, polyvinylidene chloride, polyvinyl acetate, ethylene-vinyl acetate copolymers, polyvinyl alcohol, polyacetals, fluorine-based resins such as polyvinylidene fluoride and polytetrafluoroethylene; polyethylene terephthalate, polybutylene terephthalate, polyethylene naphthalate, polystyrene, polyacrylonitrile, styrene-acrylonitrile copolymers, acrylonitrile-butadiene-styrene copolymer (ABS) resins, polyphenylene ether, modified polyphenylene ether, aliphatic polyamides, aromatic polyamides, polyamideimides, polymethacrylic acid or esters thereof, polyacrylic acid or esters thereof, polycarbonates, polyphenylene sulfide, polysulfones, polyethersulfones, polyethernitriles, polyetherketones, polyketones, liquid crystal polymers, silicone resins, and ionomers. One of these may be used alone, or two or more of these may be used in combination.

Examples of the thermoplastic elastomers include styrene-based thermoplastic elastomers such as styrene-butadiene copolymers or hydrogenated polymers thereof and styrene-isoprene block copolymers or hydrogenated polymers thereof, olefin-based thermoplastic elastomers, vinyl chloride-based thermoplastic elastomers, polyester-based thermoplastic elastomers, polyurethane-based thermoplastic elastomers, and polyamide-based thermoplastic elastomers. One of these may be used alone, or two or more of these may be used in combination.

Examples of the thermosetting polymers include crosslinked rubbers, epoxy resins, polyimide resins, bismaleimide resins, benzocyclobutene resins, phenolic resins, unsaturated polyesters, diallyl phthalate resins, silicone resins, polyurethanes, polyimide silicones, thermosetting polyphenylene ether, and thermosetting modified polyphenylene ether. One of these may be used alone, or two or more of these may be used in combination.

Examples of the crosslinked rubbers include natural rubbers, butadiene rubbers, isoprene rubbers, nitrile rubbers, hydrogenated nitrile rubbers, chloroprene rubbers, ethylene propylene rubbers, chlorinated polyethylene, chlorosulfonated polyethylene, butyl rubbers, halogenated butyl rubbers, fluororubbers, urethane rubbers, acrylic rubbers, polyisobutylene rubbers, and silicone rubbers. One of these may be used alone, or two or more of these may be used in combination.

The method for curing the curable resin composition is not particularly limited and can be appropriately selected according to the performance required of the thermally conductive sheet. For example, a curing agent- mixing type, a solvent volatilization type, a heat curing type, a heat melting type, and an ultraviolet curing type can be used.

In this embodiment, in terms of excellent molding processability and weather resistance as well as close adhesiveness and conformability to an electronic part, curing agent-mixing type silicone resins are preferably used. The silicone resins are not particularly limited and can be appropriately selected according to the purpose. Examples of the silicone resins include addition reaction type liquid silicone rubbers and heat-vulcanizable millable type silicone rubbers using a peroxide for vulcanization. Among these, addition reaction type liquid silicone rubbers are particularly preferred because the close adhesiveness between the heat-generating surface of an electronic part and a heat sink surface is required of a heat-dissipating member of electronic equipment,.

The content of the curable resin composition in the thermally conductive sheet is not particularly limited and can be, for example, 25% by volume or more and 45% by volume or less.

[Thermally Conductive Fibers]

As the thermally conductive fibers, for example, carbon fibers can be used. As the carbon fibers, for example, pitch-based carbon fibers, PAN-based carbon fibers, and carbon fibers synthesized by an arc discharge method, a laser evaporation method, a CVD method (chemical vapor deposition method), a CCVD method (catalytic chemical vapor deposition method), or the like can be used. Among these, pitch-based carbon fibers and carbon fibers obtained by graphitizing polybenzazole are particularly preferred in terms of thermal conduction.

The pitch-based carbon fibers are obtained by treatment steps such as melt spinning, infusibilization, and carbonization followed by heat treatment at a high temperature of 2000° C. to 3000° C. or more than 3000° C. for graphitization using pitch as the main raw material. The raw material pitch is divided into isotropic pitch that is optically disordered and exhibits no deflection and anisotropic pitch (mesophase pitch) in which the constituent molecules are arranged like a liquid crystal and which exhibits optical anisotropy. Carbon fibers made from anisotropic pitch have better mechanical properties and higher electrical and thermal conductivity than carbon fibers made from isotropic pitch. Therefore, mesophase pitch-based graphitized carbon fibers are preferably used.

The carbon fibers can be subjected to surface-treating, as needed, before use in which some or all of them are treated. Examples of the surface treatment include oxidation treatment, nitriding treatment, nitration, sulfonation, or treatment in which a metal, a metal compound, an organic compound, or the like is attached or bonded to a functional group introduced onto the surfaces by these treatments or to the surfaces of the carbon fibers. Examples of the functional group include a hydroxyl group, a carboxyl group, a carbonyl group, a nitro group, and an amino group.

The average fiber length of the thermally conductive fibers is preferably 40 µm or more and 250 µm or less. By setting the average fiber length of the thermally conductive fibers at 40 µm or more and 250 µm or less, the thermally conductive fibers are easily entangled with each other, and thus the thermal conductivity of the thermally conductive sheet in the thickness direction can be better. In addition, in order to adjust the average fiber length, carbon fibers having different average fiber lengths may be mixed. The average fiber length of the thermally conductive fibers can be measured, for example, by a particle size distribution meter, a microscope, or a scanning electron microscope (SEM).

The content of the thermally conductive fibers in the thermally conductive sheet is preferably 15% by volume or more and 35% by volume or less. By setting the content of the thermally conductive fibers at 15% by volume or more, the thermal resistance value can be more effectively lowered, and therefore the thermal conductivity of the thermally conductive sheet in the thickness direction can be better. In addition, by setting the content of the thermally conductive fibers at 35% by volume or less, difficult extrusion can be prevented when the thermally conductive composition is extruded, for example, by an extruder.

[Thermally Conductive Particles]

The thermally conductive particles are used in order to easily align the thermally conductive fibers in a predetermined direction, that is, easily orient the thermally conductive fibers along the extrusion direction, by a difference in flow velocity from the thermally conductive fibers in the thermally conductive composition. In addition, the thermally conductive particles are also used in order to maintain the shape of the thermally conductive sheet.

As the thermally conductive particles, for example, alumina, aluminum nitride, aluminum hydroxide, silica, boron nitride, titania, glass, zinc oxide, silicon carbide, silicon, silicon oxide, aluminum oxide, and metal particles can be used.

One of these may be used alone, or two or more of these may be used in combination. Among these, one or more including at least alumina among alumina, aluminum nitride, and aluminum hydroxide are preferably used.

Aluminum nitride has nitrogen in its molecule, and this nitrogen inhibits the reaction of the curable resin composition to suppress an increase in the viscosity of the thermally conductive composition. Therefore, by using aluminum nitride, compared with when only alumina particles are used as the thermally conductive particles, the thermally conductive fibers can be more effectively oriented along the thickness direction of the thermally conductive sheet, and thus the thermal conductivity of the thermally conductive sheet in the thickness direction can be good.

In addition, the thermally conductive particles are preferably surface-treated, for example, with a silane coupling agent. By surface-treating the thermally conductive particles, it is possible to improve the dispersibility and improve the flexibility of the thermally conductive sheet. In addition, it allows the surface roughness obtained by slicing to become smaller.

The average particle diameter of the thermally conductive particles is preferably 0.5 μm or more and 10 μm or less. When the average particle diameter is less than 0.5 μm, poor curing may be caused. When the average particle diameter is more than 10 μm, the orientation of the carbon fibers may be inhibited to lower the thermal conductivity of the cured product.

In addition, by using two or more kinds of particles having different particle diameters for the thermally conductive particles, the thermally conductive fibers can be more effectively easily oriented along the thickness direction of the thermally conductive sheet, and thus the thermal conductivity of the thermally conductive sheet in the thickness direction can be better. When two or more kinds of particles having different particle diameters are used as the thermally conductive particles, it is preferred that the large spherical particles be 3 μm or more and 10 μm or less, and that the small spherical particles be 0.3 μm or more and 3 μm or less. Thereby, the thermally conductive fibers can be more effectively easily oriented along the thickness direction of the thermally conductive sheet, and thus the thermal conductivity of the thermally conductive sheet in the thickness direction can be good. The average particle diameter of the thermally conductive particles can be measured, for example, by a particle size distribution meter or a scanning electron microscope (SEM).

The content of the thermally conductive particles in the thermally conductive sheet is preferably 20% by volume or more and 60% by volume or less. In addition, by setting the content of the thermally conductive particles at 20% by volume or more and 60% by volume or less, the orientation of the thermally conductive fibers are not easily disturbed, and therefore the thermal conductivity of the thermally conductive sheet in the thickness direction can be better.

In addition, other components, for example, a solvent, a thixotropic agent, a dispersing agent, a curing agent, a curing accelerator, a retarder, a slight tackiness-providing agent, a plasticizer, a flame retardant, an antioxidant, a stabilizer, and a colorant, can be further blended in the above-described thermally conductive composition as needed.

In addition, the thickness of the thermally conductive sheet is preferably 0.1 mm or more. When the thickness of the thermally conductive sheet is less than 0.1 mm, the shape sometimes cannot be maintained during slicing depending on the hardness of the cured product. It is also possible to form dot shapes or line shapes on the obtained sheet and a tacky layer on the outer periphery.

<2. Method For Producing Thermally Conductive Sheet>

Next, a method for producing the above-described thermally conductive sheet will be described. A method for producing a thermally conductive sheet according to this embodiment has a thermally conductive composition preparing step S1, a molding step S2, and a cutting step S3 as shown in FIG. 1.

[Thermally Conductive Composition-Preparing Step S1]

In the thermally conductive composition-preparing step S1, a curable resin composition, thermally conductive fibers, thermally conductive particles, and the like are mixed using a mixer or the like to prepare the above-described thermally conductive composition. For example, it is preferred that the amount of the thermally conductive fibers blended in the thermally conductive composition be 15% by volume or more and 35% by volume or less, and that the amount of the thermally conductive particles blended in the thermally conductive composition be 20% by volume or more and 60% by volume or less.

[Molding Step S2]

In the molding step S2, the thermally conductive composition prepared in the thermally conductive composition-preparing step S1 is extrusion-molded into a mold using a pump, an extruder, or the like, and a columnar cured product is obtained. As for the mold, the shape, size, material, and the like are not particularly limited and can be appropriately selected according to the purpose. Examples of the shape include a hollow cylindrical shape and a hollow prismatic shape. The size can be appropriately selected according to the size of the thermally conductive sheet to be fabricated. Examples of the material include stainless steel.

The molded body by extrusion-molding is formed into a cured product by a suitable curing reaction according to the resin used. The method for curing the extrusion-molded body is not particularly limited and can be appropriately selected according to the purpose. For example, when a thermosetting resin such as a silicone resin is used as the curable resin composition, the extrusion-molded body is preferably cured by heating.

Examples of the apparatus used for heating include far-infrared furnaces and hot air furnaces. The heating temperature is not particularly limited and can be appropriately selected according to the purpose. For example, heating is preferably conducted at 40° C. to 150° C. The flexibility of a cured product is not particularly limited, and can be appropriately selected according to the purpose, and the flexibility can be adjusted, for example, by the crosslinking density of the silicone, the amounts of the thermally conducting fillers filled, and the like.

Figure 2:
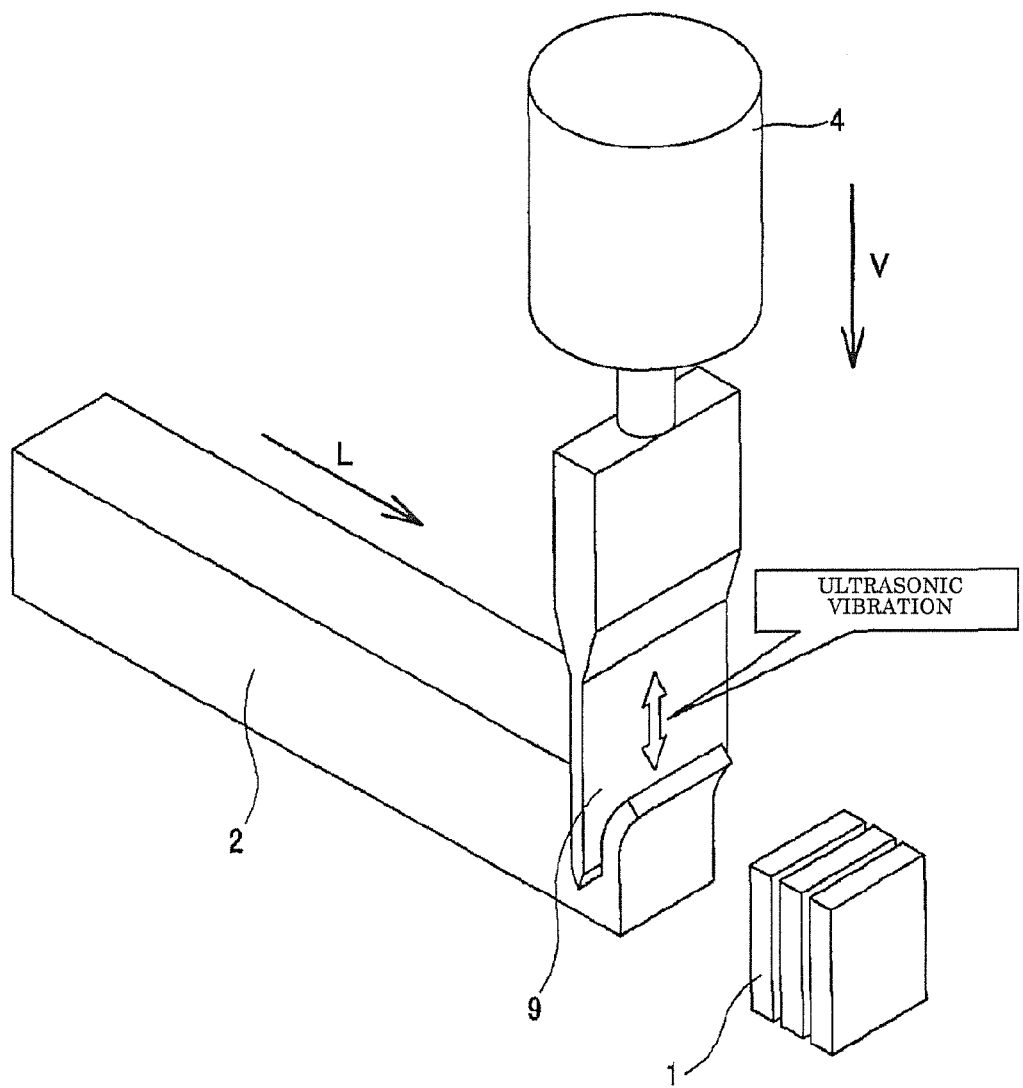
FIG. 2 is an appearance diagram showing one example of an ultrasonic cutting machine used in a cutting step in a method for producing a thermally conductive sheet according to the present invention.

Thus, for example, a columnar thermally conductive composition in which thermally conductive fibers are oriented in the columnar longitudinal direction L as shown in FIG. 2 can be formed. In a process in which the thermally conductive composition passes through a mold by an extruder or the like, the thermally conductive fibers, the thermally conductive particles, and the like are gathered in the central direction of the thermally conducting composition to reach a state in which the density of the thermally conductive fibers is different between the surface and the center. In other words, on the surface of the thermally conducting composition (molded body) that has passed through the extruder, the thermally conductive fibers do not protrude on the surface, and therefore the surface portion of the cured product obtained by curing the thermally conducting composition (molded body) (the outer peripheral portion in the thermally conductive sheet) has good slight tackiness and has good adhesiveness to an adherend (semiconductor apparatus or the like). On the other hand, on the surface that comes into contact with a heat source or the heat dissipation side, the thermally conductive fibers protrude, and therefore the slight tackiness decreases.

Here, the slight tackiness means having repeelability with small increase in adhesive force due to the passage of time and moist heat and having tackiness to the extent that the position does not shift easily in affixing to an adherend.

In the molding step S2, for example, the thermally conductive composition made in the thermally conductive composition preparing step S1 may be applied to a polyester film to which a release material is applied to form the columnar thermally conductive composition as shown in FIG. 2.

[Cutting Step S3]

Figure 3:
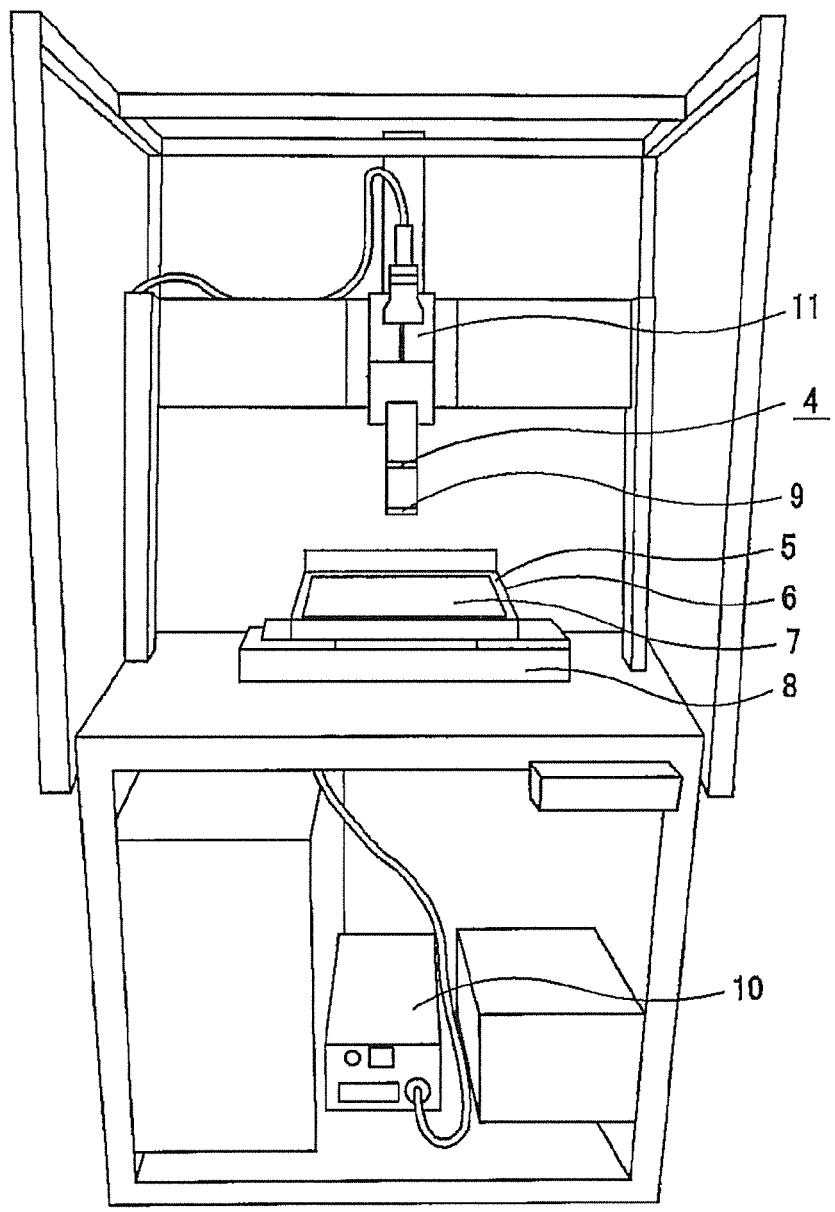
FIG. 3 is an appearance diagram showing one example of a slicing apparatus.

The cutting step S3 is the step of cutting the columnar cured product in a direction almost perpendicular to the length direction of the column to a predetermined thickness to obtain a thermally conductive sheet having the surface with the L* value in the L*a*b color system of 29 or more and 47 or less. For example, as shown in FIG. 2 and FIG. 3, by slicing a columnar thermally conductive composition 2 in the direction V orthogonal to the longitudinal direction L of the columnar thermally conductive composition 2 by an ultrasonic cutter 4 using an ultrasonic cutting machine 3, a thermally conductive sheet 1 can be formed in a state in which the orientation of thermally conductive fibers is kept. Therefore, the thermally conductive sheet 1 in which the orientation of the thermally conductive fibers is maintained in the thickness direction and which has good thermal conduction properties can be obtained.

The ultrasonic cutting machine 3 includes a work table 5 on which the columnar thermally conductive composition 2 is to be placed, and the ultrasonic cutter 4 for slicing the columnar thermally conductive composition 2 on the work table 5 while applying ultrasonic vibration, as shown in FIG. 3.

In the work table 5, a silicone rubber 7 is disposed on a metallic movable carriage 6. The movable carriage 6 is movable in a predetermined direction by a moving mechanism 8 and operates to sequentially feed the columnar thermally conductive composition 2 below the ultrasonic cutter 4. The silicone rubber 7 has a thickness enough to receive the cutting edge of the ultrasonic cutter 4. In the work table 5, when the columnar thermally conductive composition 2 is placed on the silicone rubber 7, the movable carriage 6 is moved in a predetermined direction according to the slicing operation of the ultrasonic cutter 4 and sequentially feeds the columnar thermally conductive composition 2 below the ultrasonic cutter 4.

The ultrasonic cutter 4 has a knife 9 for slicing the columnar thermally conductive composition 2, an ultrasonic oscillation mechanism 10 for applying ultrasonic vibration to the knife 9, and a raising and lowering mechanism 11 for operating to raise and lower the knife 9.

The cutting edge of the knife 9 is directed to the work table 5, and by being operated to rise and lower by the raising and lowering mechanism 11, the knife 9 slices the columnar thermally conductive composition 2 placed on the work table 5. The knife 9 can use a single edge or a double edge capable of ultrasonic oscillation. For the double edge, when the double edge is lowered perpendicularly to the molded body, the thickness of the sliced sheet is inclined in the plane, and therefore it is necessary to tilt the double edge so that the cutting edge of the double edge is perpendicular to the molded body. The angle of the tilt is half the angle of the cutting edge of the double edge. The dimensions and material of the knife 9 are determined according to the size, composition, and the like of the columnar thermally conductive composition 2, and, for example, the knife 9 is formed of steel having a width of 40 mm, a thickness of 1.5 mm, and a cutting edge angle of 10°. Next, by curing the obtained molded body and then cutting so that the edge cuts in perpendicularly to the cured product, the cured product can be cut to uniform thickness, the surface roughness of the cut surface can be decreased, and therefore the thermal resistance at the interface lowers, and a thermally conductive sheet having high thermal conduction in the thickness direction of the sheet can be fabricated. The surface roughness Ra can be measured, for example, by a laser microscope.

The ultrasonic oscillation mechanism 10 applies ultrasonic vibration to the knife 9 in the slicing direction of the columnar thermally conductive composition 2, and it is preferred that the oscillation frequency be adjusted in the range of 10 kHz to 100 kHz, and that the amplitude be adjusted in the range of 10 μm to 100 μm.

In the thermally conductive sheet 1 sliced by the ultrasonic cutting machine 3 while applying ultrasonic vibration, the thermal resistance is kept lower than in a thermally conductive sheet sliced without applying ultrasonic vibration. The reason of this is as follows: since the ultrasonic cutting machine 3 applies ultrasonic vibration in the slicing direction to the ultrasonic cutter 4, the interfacial thermal resistance is low, and the thermally conductive fibers oriented in the thickness direction of the thermally conductive sheet 1 are not easily toppled sideways by the knife 9. On the other hand, in the thermally conductive sheet sliced without applying ultrasonic vibration, the orientation of the thermally conductive fibers is disturbed by the frictional resistance of the knife, and exposure to the cut surface decreases, and therefore the thermal resistance increases. Therefore, by using the ultrasonic cutting machine 3, the thermally conductive sheet 1 having excellent thermal conduction properties can be obtained.

In this manner, by cutting the molded body in which the curing reaction is completed in the direction perpendicular to the extrusion direction to a predetermined thickness, a thermally conductive sheet in which thermally conductive fibers are oriented in the thickness direction of the thermally conductive sheet (perpendicularly oriented) can be obtained. The thickness of the thermally conductive sheet is preferably 0.1 mm or more. When the thickness is less than 0.1 mm, the shape sometimes cannot be maintained during slicing depending on the hardness of the cured product. In addition, during slicing, the molded body may be sliced while the temperature is adjusted such as cooling or heating. In addition, the molded body may be sliced while the edge is cooled.

<3. Another Method For Producing Thermally Conductive Sheet>

The thermally conductive sheet 1 may be fabricated by the following producing method. In other words, as shown in FIG. 4, the molding step S2 of the method for producing a thermally conductive sheet described above may have a temporary molding step S21, an alignment step S22, and a full molding step S23. In the following description, the detailed description of the thermally conductive composition-preparing step S1 and the cutting step S3 described above is omitted.

[Temporary Molding Step S21]

Figure 5A:
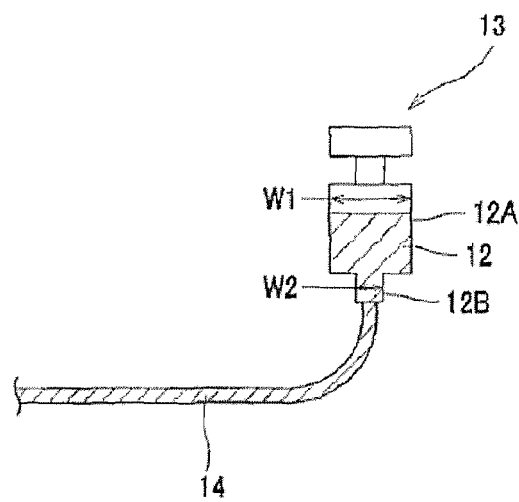
FIG. 5A is a schematic diagram for explaining one example of a temporary molding step in a method for producing a thermally conductive sheet according to the present invention.

In the temporary molding step S21, a thermally conductive composition 12 prepared in the thermally conductive composition preparing step S1 is extruded by an extruder 13 to mold an elongated columnar temporarily molded body 14 in which thermally conductive fibers are oriented along the extrusion direction (hereinafter referred to as a temporarily molded body 14), as shown in FIG. 5A.

For example, it is preferred that the extruder 13 be formed in an elongated cylindrical shape, and that the bore W2 of the opening 12B on the side on which the thermally conductive composition 12 is discharged is reduced more than the inner diameter W1 of a main body portion 12A, as shown in FIG. 5A. In addition, in the extruder 13, the inner diameter W1 of the main body portion 12a may be reduced in a tapered manner from a predetermined position in the longitudinal direction toward the extrusion direction to reduce the bore W2 of the opening 12B more than the inner diameter W1 of the main body portion 12A. By extruding the thermally conductive composition 12 by such an extruder 13 to pass the thermally conductive composition 12 toward the portion where the diameter is reduced more than the inner diameter W1 of the main body portion 12A in the extruder 13, the thermally conductive fibers easily follow the extrusion direction. Thus, the thermally conductive fibers can be more reliably oriented in the longitudinal direction of the temporarily molded body 14.

For example, in the extruder 13, when the content of the thermally conductive fibers in the thermally conductive composition 12 is 15% by volume or more and 25% by volume or less, the bore W2 of the opening 12B is preferably of the order of 1.5 mm to 9.5 mm. In this case, by setting the bore W2 of the opening 12B at 1.5 mm or more, difficult extrusion can be prevented when the thermally conductive composition 12 is extruded by the extruder 13. In addition, by setting the bore W2 of the opening 12B at 9.5 mm or less, the orientation of the thermally conductive fibers are not easily disturbed, and therefore the thermal conductivity of the thermally conductive sheet 1 in the thickness direction can be better.

In the extruder 13, the cross-sectional shape of the opening 12B can be, for example, a circular shape, a triangular shape, a rectangular shape, or a square shape but is preferably a rectangular shape or a square shape. By making the cross-sectional shape of the opening 12B a rectangular shape or a square shape, the temporarily molded body 14 has a prismatic shape. Therefore, when a plurality of the temporarily molded bodies 14 are aligned so as to be adjacent to each other in the direction orthogonal to the longitudinal direction to obtain a laminate 14A in which the plurality of the temporarily molded bodies 14 aligned are disposed in a direction almost orthogonal to the alignment direction (hereinafter referred to as a laminate 14A) in the alignment step S22, gaps are not easily formed in the laminate 14A. Thus, bubbles are not easily contained in the laminate 14A, and therefore a fully molded body 16 having better flame retardancy can be obtained in the full molding step S23.

In the temporarily molded body 14, the thermally conductive fibers are oriented along the direction of extrusion by the extruder 13, and the temporarily molded body 14 has an elongated columnar shape, for example, an elongated quadrangular prism shape, an elongated triangular prism shape, or an elongated cylindrical shape.

[Alignment Step S22]

Figure 5B:
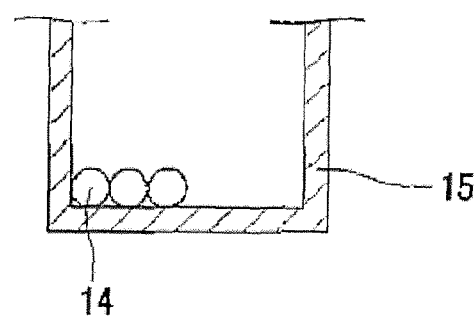
FIG. 5B is a schematic diagram for explaining one example of an alignment step in a method for producing a thermally conductive sheet according to the present invention (part 1).
Figure 5C:
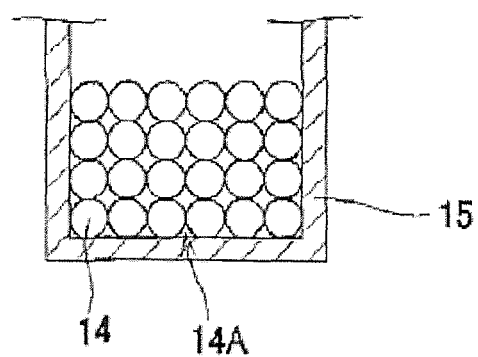
FIG. 5C is a schematic diagram for explaining one example of an alignment step in a method for producing a thermally conductive sheet according to the present invention (part 2).
Figure 6:
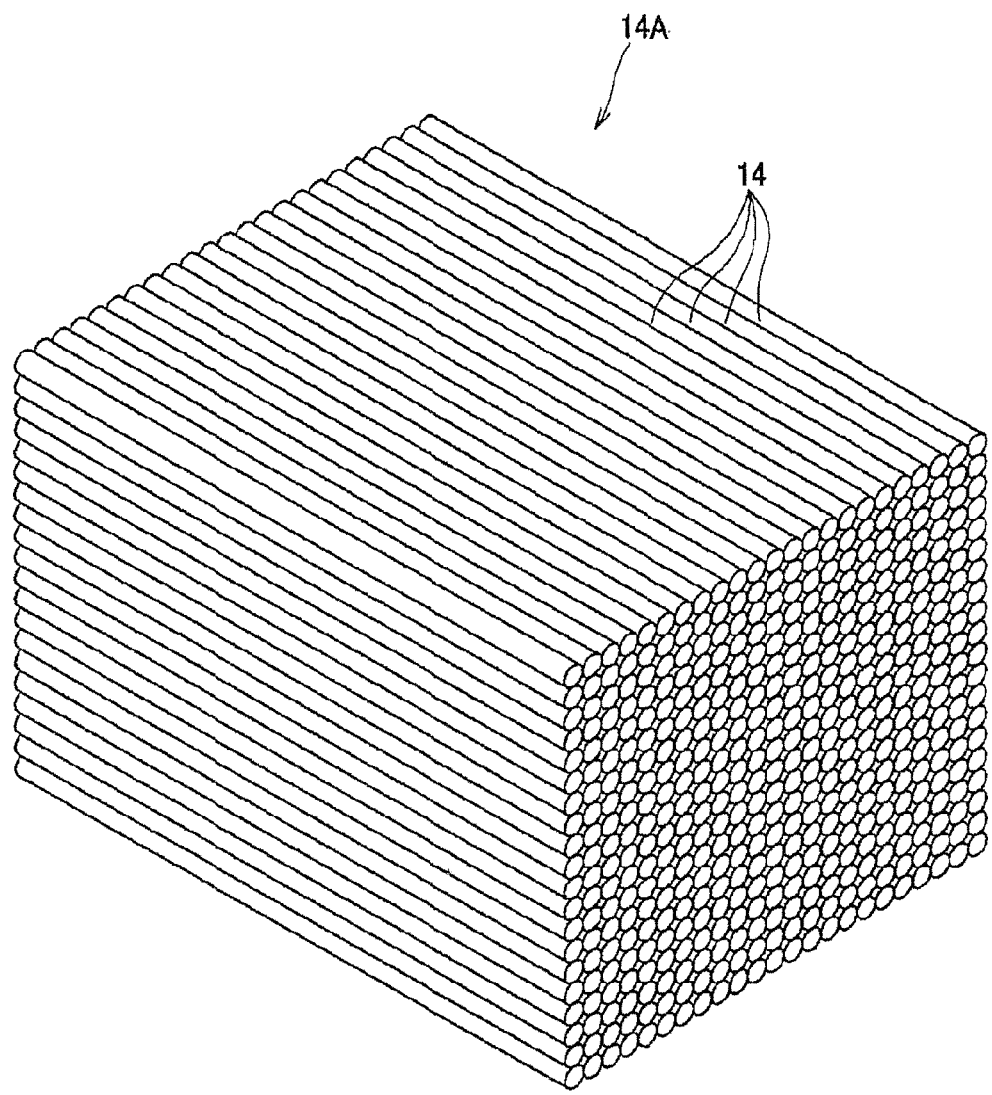
FIG. 6 is a perspective view showing one example of a laminate obtained in the alignment step in a method for producing a thermally conductive sheet according to the present invention.

In the alignment step S22, for example, as shown in FIG. 5B, FIG. 5C, and FIG. 6, the plurality of the temporarily molded bodies 14 molded in the temporary molding step S21 are aligned so as to be adjacent to each other in the direction orthogonal to the longitudinal direction to obtain the laminate 14A. For example, in the alignment step S22, the temporarily molded bodies 14 are aligned in a predetermined frame 15 to obtain the laminate 14A in which the temporarily molded bodies 14 are disposed in a rectangular parallelepiped shape or a cube shape. The frame 15 is used as a fixing unit for fixing the laminate 14A when the fully molded body 16 is molded in the full molding step S23, and prevents the laminate 14A from deforming greatly. The frame 15 is formed, for example, of a metal.

[Full Molding Step S23]

Figure 5D:
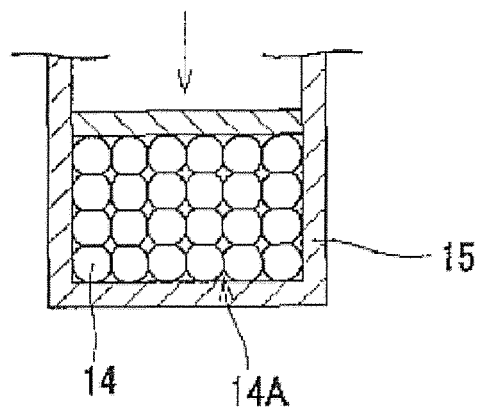
FIG. 5D is a schematic diagram for explaining one example of a full molding step in a method for producing a thermally conductive sheet according to the present invention.
Figure 5E:
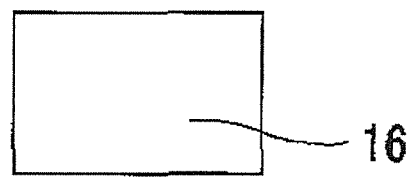
FIG. 5E is a schematic diagram of a fully molded body obtained by a method for producing a thermally conductive sheet according to the present invention (a method illustrated in FIGS. 5A to 5D).
Figure 7A:
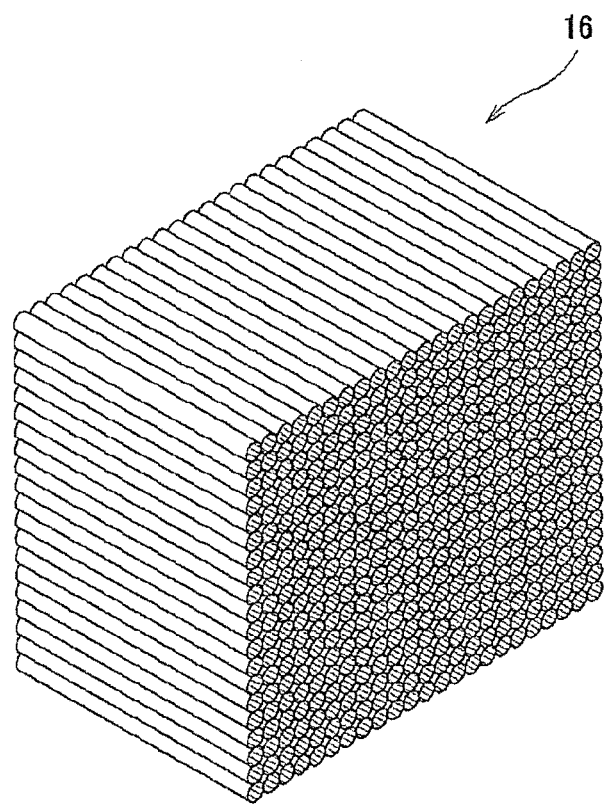
FIG. 7A is a perspective view showing one example of a fully molded body not subjected to pressing
Figure 7B:
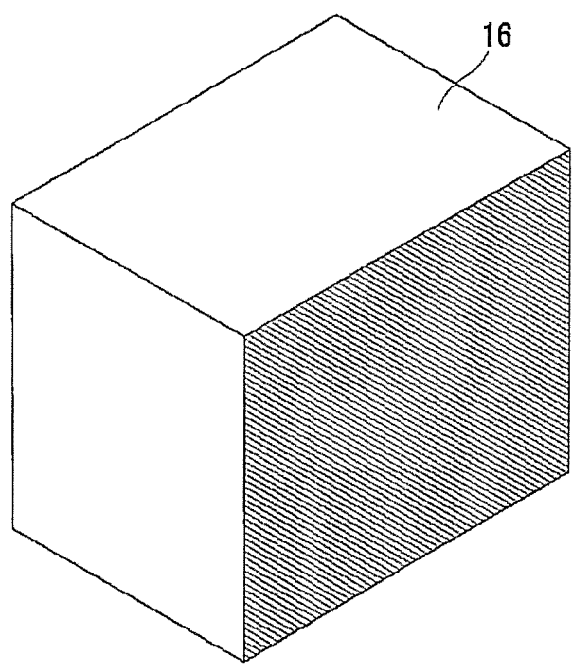
FIG. 7B is a perspective view showing one example of a fully molded body subjected to pressing.

In the full molding step S23, for example, the laminate 14A obtained in the alignment step S22 is cured as shown in FIG. 5D to mold the fully molded body 16 in which the temporarily molded bodies 14 constituting the laminate 14A are integrated with each other as shown in FIG. 5E and FIGS. 7A and 7B. Examples of the method for curing the laminate 14A include a method of heating the laminate 14A by a heating apparatus, and a method of heating and pressurizing the laminate 14A by a heating and pressurizing apparatus. In addition, when an acrylic resin is used as the curable resin composition constituting the thermally conductive composition 12, the laminate 14A can be cured at ordinary temperature, for example, by containing an isocyanate compound in the thermally conductive composition 12.

As these methods for curing the laminate 14A, the method of heating and pressurizing the laminate 14A by a heating and pressurizing apparatus, that is, pressing in the direction orthogonal to the longitudinal direction of the plurality of the temporarily molded bodies 14 constituting the laminate 14A (perpendicular direction) when curing the laminate 14A is preferred. By pressing the laminate 14A in this manner, bubbles can be more reliably removed from the laminate 14A, and therefore the fully molded body 16 having better flame retardancy can be obtained in the full molding step S23.

By aligning a plurality of columnar temporarily molded bodies in the longitudinal direction, molding a fully molded body in which the plurality of temporarily molded bodies are integrated with each other, and cutting in a direction almost orthogonal to the longitudinal direction of the fully molded body in this manner, the thermally conductive fibers in the thermally conductive sheet 1 can be more reliably aligned in the same direction, and the thermal conductivity of the thermally conductive sheet 1 in the thickness direction can be better.

4. EXAMPLES

Examples

Examples of the present invention will be described below. In the Examples, a silicone resin composition containing thermally conductive fibers and thermally conductive particles was prepared, and the L* value in the L*a*b color system of the surface of a thermally conductive sheet obtained from the silicone resin composition, the thermal conductivity of the thermally conductive sheet in the thickness direction, the fraction defective of the thermally conductive sheet, and the appearance of the thermally conductive sheet were evaluated. In addition, in this Examples, the average fiber length of the thermally conductive fibers is a calculated value obtained by measuring each thermally conductive fiber by a microscope (manufactured by HiROX Co. Ltd., KH7700), and the average particle diameter of the thermally conductive particles is a value measured by a particle size distribution meter. The present invention is not limited to these Examples.

[Measurement of L* Value]

The surface of a thermally conductive sheet was measured using a spectrophotometer. The lightness L* represented by the "L*" value was measured using the color specification of the L*a*b color system prescribed in "JIS Z 8729" and "JIS Z 8730."

[Measurement of Thermal Conductivity]

The thermal conductivity of a thermally conductive sheet was measured by a measurement method according to ASTM-D5470 by applying a load of 1 kgf/cm².

[Fraction Defective]

A thermally conductive sheet in which air bubbles were trapped in the surface when the thermally conductive sheet was sliced from a silicone cured product, and a thermally conductive sheet in which through holes were present were taken as poor, and their proportion was calculated. The presence or absence of bubbles and the presence or absence of through holes were determined by visually inspecting the surface of a thermally conductive sheet.

[Appearance Evaluation]

A thermally conductive sheet was observed by visual inspection, and a case where a defect such as debonding in the thermally conductive sheet, or the shape of the thermally conductive sheet being impossible to maintain occurred was taken as "poor," and others were taken as "good."

Example 1

In Example 1, 40% by volume of alumina particles having an average particle diameter of 5 μm coupling-treated with a silane coupling agent as thermally conductive particles and 20% by volume of pitch-based carbon fibers having an average fiber length of 40 μm as thermally conductive fibers were mixed with a two-part addition reaction type liquid silicone resin for 2 hours to prepare a silicone resin composition.

For the two-part addition reaction type liquid silicone resin, one containing organopolysiloxanes as main components was used, and 16.8% by volume of a silicone A liquid and 18.8% by volume of a silicone B liquid were mixed. The obtained silicone resin composition was extrusion-molded into a hollow quadrangular prism-shaped mold (35 mm×35 mm) to mold a 35 mm square silicone molded body. The silicone molded body was heated in an oven at 100° C. for 6 hours to form a silicone cured product. The silicone cured product was cut to a thickness of 2.0 mm by an ultrasonic cutter to obtain a thermally conductive sheet. The slicing speed of the ultrasonic cutter was 50 mm per second. In addition, for the ultrasonic vibration applied to the ultrasonic cutter, the oscillation frequency was 20.5 kHz, and the amplitude was 60 μm.

The measurement and evaluation results of the thermally conductive sheet of Example 1 are shown in Table 1. The lightness L* of the thermally conductive sheet was 29.8, and the thermal conductivity was 10.2 W/mK. In addition, the fraction defective of the thermally conductive sheet was less than 5%, and the appearance was good.

Example 2

In Example 2, 37% by volume of alumina particles having an average particle diameter of 5 μm coupling-treated with a silane coupling agent as thermally conductive particles and 25% by volume of pitch-based carbon fibers having an average fiber length of 250 μm as thermally conductive fibers were mixed with a two-part addition reaction type liquid silicone resin for 4 hours to prepare a silicone resin composition. Except this, a thermally conductive sheet was obtained as in Example 1.

The measurement and evaluation results of the thermally conductive sheet of Example 2 are shown in Table 1. The lightness L* of the thermally conductive sheet was 29.1, and the thermal conductivity was 15.4 W/mK. In addition, the fraction defective of the thermally conductive sheet was less than 5%, and the appearance was good.

Example 3

In Example 3, 19% by volume of alumina particles having an average particle diameter of 5 μm coupling-treated with a silane coupling agent and 24% by volume of aluminum nitride particles having an average particle diameter of 1 μm coupling-treated with a silane coupling agent as thermally conductive particles and 3% by volume of pitch-based carbon fibers having an average fiber length of 150 μm as thermally conductive fibers were mixed with a two-part addition reaction type liquid silicone resin for 4 hours to prepare a silicone resin composition. Except this, a thermally conductive sheet was obtained as in Example 1.

The measurement and evaluation results of the thermally conductive sheet of Example 3 are shown in Table 1. The lightness L* of the thermally conductive sheet was 37.5, and the thermal conductivity was 23.2 W/mK. In addition, the fraction defective of the thermally conductive sheet was less than 5%, and the appearance was good.

Example 4

In Example 4, 18% by volume of alumina particles having an average particle diameter of 5 μm coupling-treated with a silane coupling agent and 22% by volume of aluminum nitride particles having an average particle diameter of 1 μm coupling-treated with a silane coupling agent as thermally conductive particles and 32% by volume of pitch-based carbon fibers having an average fiber length of 100 μm as thermally conductive fibers were mixed with a two-part addition reaction type liquid silicone resin for 4 hours to prepare a silicone resin composition. Except this, a thermally conductive sheet was obtained as in Example 1.

The measurement and evaluation results of the thermally conductive sheet of Example 4 are shown in Table 1. The lightness L* of the thermally conductive sheet was 31.2, and the thermal conductivity was 26.3 W/mK. In addition, the fraction defective of the thermally conductive sheet was less than 5%, and the appearance was good.

Example 5

In Example 5, 25% by volume of alumina particles having an average particle diameter of 5 μm coupling-treated with a silane coupling agent and 7% by volume of aluminum nitride particles having an average particle diameter of 1 μm coupling-treated with a silane coupling agent as thermally conductive particles and 34% by volume of pitch-based carbon fibers having an average fiber length of 150 μm as thermally conductive fibers were mixed with a two-part addition reaction type liquid silicone resin for 4 hours to prepare a silicone resin composition. Except this, a thermally conductive sheet was obtained as in Example 1.

The measurement and evaluation results of the thermally conductive sheet of Example 5 are shown in Table 1. The lightness L* of the thermally conductive sheet was 30.6, and the thermal conductivity was 14.8 W/mK. In addition, the fraction defective of the thermally conductive sheet was less than 5%, and the appearance was good.

Example 6

In Example 6, 6% by volume of alumina particles having an average particle diameter of 5 μm coupling-treated with a silane coupling agent and 7% by volume of aluminum nitride particles having an average particle diameter of 1 μm coupling-treated with a silane coupling agent as thermally conductive particles and 34% by volume of pitch-based carbon fibers having an average fiber length of 150 μm as thermally conductive fibers were mixed with a two-part addition reaction type liquid silicone resin for 4 hours to prepare a silicone resin composition. Except this, a thermally conductive sheet was obtained as in Example 1.

The measurement and evaluation results of the thermally conductive sheet of Example 6 are shown in Table 1. The lightness L* of the thermally conductive sheet was 45.3, and the thermal conductivity was 17.2 W/mK. In addition, the fraction defective of the thermally conductive sheet was less than 5%, and the appearance was good.

Example 7

In Example 7, 30% by volume of alumina particles having an average particle diameter of 5 μm coupling-treated with a silane coupling agent and 3% by volume of aluminum hydroxide particles having an average particle diameter of 3 μm coupling-treated with a silane coupling agent as thermally conductive particles and 20% by volume of pitch-based carbon fibers having an average fiber length of 150 μm as thermally conductive fibers were mixed with a two-part addition reaction type liquid silicone resin for 4 hours to prepare a silicone resin composition. Except this, a thermally conductive sheet was obtained as in Example 1.

The measurement and evaluation results of the thermally conductive sheet of Example 7 are shown in Table 1. The lightness L* of the thermally conductive sheet was 34.3, and the thermal conductivity was 11.2 W/mK. In addition, the fraction defective of the thermally conductive sheet was less than 5%, and the appearance was good.

Comparative Example 1

In Comparative Example 1, 40% by volume of pitch-based carbon fibers having an average fiber length of 150 μm as thermally conductive fibers were mixed with a two-part addition reaction type liquid silicone resin for 4 hours to prepare a silicone resin composition. Except this, Comparative Example 1 was the same as Example 1.

The measurement and evaluation results of the thermally conductive sheet of Comparative Example 1 are shown in Table 1. The shape of the silicone cured product could not be maintained, and therefore the lightness L*, thermal conductivity, fraction defective, and appearance of the thermally conductive sheet could not be evaluated.

Comparative Example 2

In Comparative Example 2, 50% by volume of alumina particles having an average particle diameter of 5 μm coupling-treated with a silane coupling agent as thermally conductive particles and 10% by volume of pitch-based carbon fibers having an average fiber length of 250 μm (manufactured by TEIJIN LIMITED, trade name: Raheama) as thermally conductive fibers were mixed with a two-part addition reaction type liquid silicone resin for 4 hours to prepare a silicone resin composition. Except this, a thermally conductive sheet was obtained as in Example 1.

The measurement and evaluation results of the thermally conductive sheet of Comparative Example 7 are shown in Table 1. The lightness L* of the thermally conductive sheet was 47.3, and the thermal conductivity was 6.5 W/mK. In addition, the fraction defective of the thermally conductive sheet was less than 5%, and the appearance was good.

Referential Example 1

In Referential Example 1, 40% by volume of alumina particles having an average particle diameter of 5 μm coupling-treated with a silane coupling agent as thermally conductive particles and 20% by volume of pitch-based carbon fibers having an average fiber length of 40 μm as thermally conductive fibers were mixed with a two-part addition reaction type liquid silicone resin for 2 hours to prepare a silicone resin composition.

For the two-part addition reaction type liquid silicone resin, one obtained by mixing 16.8% by volume of a silicone A liquid and 18.8% by volume of a silicone B liquid was used. The obtained silicone resin composition was applied to release PET to a thickness of 2 mm by a bar coater and cured at 100° C. for 6 hours, and then the step of applying the silicone resin composition to a thickness of 2 mm by a bar coater was further repeated to fabricate a molded body having a thickness of 40 mm to mold a 40 mm square silicone molded body. The silicone molded body was heated in an oven at 100° C. for 6 hours to form a silicone cured product. The silicone cured product was cut to a thickness of 2.0 mm by an ultrasonic cutter to obtain a thermally conductive sheet. The slicing speed of the ultrasonic cutter was 50 mm per second. In addition, for the ultrasonic vibration applied to the ultrasonic cutter, the oscillation frequency was 20.5 kHz, and the amplitude was 60 μm.

The measurement and evaluation results of the thermally conductive sheet of Referential Example 1 are shown in Table 1. The lightness L* of the thermally conductive sheet was 29.4, and the thermal conductivity was 8.6 W/mK. In addition, the fraction defective of the thermally conductive sheet was 25%. Debonding occurred at the lamination interfaces during the measurement of the thermal conductivity, and the appearance was poor.

Referential Example 2

In Referential Example 2, 19% by volume of alumina particles having an average particle diameter of 5 μm coupling-treated with a silane coupling agent and 24% by volume of aluminum nitride particles having an average particle diameter of 1 μm coupling-treated with a silane coupling agent as thermally conductive particles and 25% by volume of pitch-based carbon fibers having an average fiber length of 150 μm as thermally conductive fibers were mixed with a two-part addition reaction type liquid silicone resin for 4 hours to prepare a silicone resin composition. Except this, a thermally conductive sheet was obtained as in Referential Example 1.

The measurement and evaluation results of the thermally conductive sheet of Referential Example 2 are shown in Table 1. The lightness L* of the thermally conductive sheet was 27.9, and the thermal conductivity was 18.7 W/mK. In addition, the fraction defective of the thermally conductive sheet was 16%. Debonding occurred at the lamination interfaces during the measurement of the thermal conductivity, and the appearance was poor.

Referential Example 3

In Referential Example 3, 18% by volume of alumina particles having an average particle diameter of 5 μm coupling-treated with a silane coupling agent and 22% by volume of aluminum nitride particles having an average particle diameter of 1 μm coupling-treated with a silane coupling agent as thermally conductive particles and 32% by volume of pitch-based carbon fibers having an average fiber length of 100 μm as thermally conductive fibers were mixed with a two-part addition reaction type liquid silicone resin for 4 hours to prepare a silicone resin composition. Except this, a thermally conductive sheet was obtained as in Referential Example 1.

The measurement and evaluation results of the thermally conductive sheet of Referential Example 3 are shown in Table 1. The lightness L* of the thermally conductive sheet was 36.1, and the thermal conductivity was 20.1 W/mK. In addition, the fraction defective of the thermally conductive sheet was 21%. Debonding occurred at the lamination interfaces during the measurement of the thermal conductivity, and the appearance was poor.

TABLE 1

|  | Example 1 | Example 2 | Example 3 | Example 4 | Example 5 | Example 6 | Example 7 |
|---|---|---|---|---|---|---|---|
| Alumina [particle diameter 5 μm] | 40 vol % | 37 vol % | 19 vol % | 18 vol % | 25 vol % | 6 vol % | 30 vol % |
| Aluminum nitride [particle diameter 1 μm] | — | — | 24 vol % | 22 vol % | 7 vol % | 28 vol % | — |
| Carbon fibers | 20 vol % | 25 vol % | 23 vol % | 32 vol % | 34 vol % | 33 vol % | 20 vol % |
| Aluminum hydroxide [particle diameter 3 μm] | — | — | — | — | — | — | 3 vol % |
| Average fiber length of carbon fibers [μm] | 40 | 250 | 150 | 100 | 150 | 150 | 150 |
| Producing method | Extrusion | Extrusion | Extrusion | Extrusion | Extrusion | Extrusion | Extrusion |
| Lightness L* | 29.8 | 29.1 | 37.5 | 31.2 | 30.6 | 45.3 | 34.3 |
| Thermal conductivity [W/mK] | 10.2 | 15.4 | 23.2 | 26.3 | 14.8 | 17.2 | 11.2 |
| Fraction defective | Less than 5% | Less than 5% | Less than 5% | Less than 5% | Less than 5% | Less than 5% | Less than 5% |
| Appearance evaluation | Good | Good | Good | Good | Good | Good | Good |

|  | Comparative Example 1 | Comparative Example 2 | Referential Example 1 | Referential Example 2 | Referential Example 3 |
|---|---|---|---|---|---|
| Alumina [particle diameter 5 μm] | — | 50 vol % | 40 vol % | 19 vol % | 18 vol % |
| Aluminum nitride [particle diameter 1 μm] | — | — | — | 24 vol % | 22 vol % |
| Carbon fibers | 40 vol % | 10 vol % | 20 vol % | 25 vol % | 32 vol % |
| Aluminum hydroxide [particle diameter 3 μm] | — | — | — | — | — |

TABLE 1-continued

| | | | | | |
|---|---|---|---|---|---|
| Average fiber length of carbon fibers [μm] | 150 | 250 | 40 | 150 | 100 |
| Producing method | Extrusion | Extrusion | Lamination application | Lamination application | Lamination application |
| Lightness L* | — | 47.3 | 29.4 | 27.9 | 36.1 |
| Thermal conductivity [W/mK] | — | 6.5 | 8.6 | 18.7 | 20.1 |
| Fraction defective | — | Less than 5% | 25% | 16% | 21% |
| Appearance evaluation | Poor | Good | Poor | Poor | Poor |

As shown in Table 1, in Examples 1 to 7 in which the L* value in the L*a*b color system of the surface of the thermally conductive sheet was 29 or more and 47 or less, high thermal conductivity was obtained. On the other hand, in Comparative Example 2 in which the L* value in the L*a*b color system of the surface of the thermally conductive sheet was more than 47, the thermal conductivity was low.

In addition, from Examples 1 to 7 and Comparative Example 1, it was found that the blending of thermally conductive fibers and thermally conductive particles was necessary. In addition, it was considered that as more carbon fibers were contained, and the color approached black, the thermal properties became better, but from Examples 3 to 6, it was found that when aluminum nitride was contained, and the value of L* was large, high thermal conductivity was obtained. In addition, from Referential Examples 1 to 3, it was found that good thermal conductivity was obtained by the L* value in the L*a*b color system of the surface of the thermally conductive sheet, but since the columnar cured product was made by lamination application, debonding occurred at the lamination interfaces, and it was difficult to maintain the shape.

What is claimed is:

1. A thermally conductive sheet comprising:
   a curable resin composition;
   thermally conductive fibers; and
   thermally conductive particles,
   wherein an L* value in a L*a*b* color system of a surface of the thermally conductive sheet is 29 or more and 47 or less.

2. The thermally conductive sheet according to claim 1, wherein
   the thermally conductive fibers are carbon fibers, and
   the thermally conductive particles are alumina, combination of alumina and aluminum nitride, combination of alumina and aluminum hydroxide, or combination of alumina, aluminum nitride, and aluminum hydroxide.

3. The thermally conductive sheet according to claim 2, wherein
   an average fiber length of the thermally conductive fibers is 40 μm or more and 250 μm or less, and
   an average particle diameter of the thermally conductive particles is 0.5 μm or more and 10 μm or less.

4. The thermally conductive sheet according to claim 3, wherein the thermally conductive particles comprise two or more kinds of particles having different average particle diameters.

5. The thermally conductive sheet according to claim 1, wherein
   an amount of the thermally conductive fibers is 15% by volume or more and 35% by volume or less, and
   an amount of the thermally conductive particles is 20% by volume or more and 60% by volume or less.

6. The thermally conductive sheet according to claim 1, obtained by extrusion-molding a thermally conductive composition containing the curable resin composition, the thermally conductive fibers, and the thermally conductive particles to obtain a columnar cured product, and cutting the columnar cured product in a direction almost perpendicular to a length direction of a column.

7. The thermally conductive sheet according to claim 5, obtained by extrusion-molding a thermally conductive composition containing the curable resin composition, the thermally conductive fibers, and the thermally conductive particles to obtain a columnar cured product, and cutting the columnar cured product in a direction almost perpendicular to a length direction of a column.

8. A method for producing a thermally conductive sheet, comprising:
   preparing a thermally conductive composition comprising a curable resin composition, thermally conductive fibers, and thermally conductive particles;
   extrusion-molding the thermally conductive composition to obtain a columnar cured product; and
   cutting the columnar cured product in a direction almost perpendicular to a length direction of a column to a predetermined thickness to obtain a thermally conductive sheet having a surface with an L* value in a L*a*b* color system of 29 or more and 47 or less.

9. The method for producing a thermally conductive sheet according to claim 8, wherein
   in the molding, a plurality of columnar temporarily molded bodies are aligned so as to be adjacent to each other in a direction orthogonal to a longitudinal direction, and a fully molded body in which the plurality of temporarily molded bodies are integrated with each other is molded, and
   in the cutting, the fully molded body is cut in a direction almost orthogonal to a longitudinal direction of the fully molded body.

* * * * *